(12) United States Patent
Phan et al.

(10) Patent No.: US 11,511,950 B2
(45) Date of Patent: Nov. 29, 2022

(54) SUBSTRATE FLIPPING DEVICE

(71) Applicant: Applied Materials, Inc., Santa Clara, CA (US)

(72) Inventors: Michael Minh Phan, Austin, TX (US); Steven Trey Tindel, Austin, TX (US); Paul Benjamin Reuter, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 100 days.

(21) Appl. No.: 16/942,607

(22) Filed: Jul. 29, 2020

(65) Prior Publication Data

US 2022/0033197 A1 Feb. 3, 2022

(51) Int. Cl.
*H01L 21/68* (2006.01)
*B65G 47/91* (2006.01)
*H01L 21/687* (2006.01)

(52) U.S. Cl.
CPC ........ *B65G 47/91* (2013.01); *H01L 21/68728* (2013.01)

(58) Field of Classification Search
None
See application file for complete search history.

(56) References Cited

U.S. PATENT DOCUMENTS

| | | | | |
|---|---|---|---|---|
| 3,509,917 A | * | 5/1970 | Gartner | B25D 17/12 138/114 |
| 7,322,787 B2 | * | 1/2008 | Hashimoto | H01L 21/68707 414/754 |
| 2006/0046376 A1 | | 3/2006 | Hofer | |
| 2013/0051967 A1 | * | 2/2013 | Muramoto | H01L 21/68707 414/758 |
| 2019/0191959 A1 | * | 6/2019 | Brightbill | A47L 15/508 |

OTHER PUBLICATIONS https://www.owensdesign.com/case-study-wafer-flipper-module-for-manufacturing-processes/ retrieved Jul. 28, 2020.

\* cited by examiner

*Primary Examiner* — Ronald P Jarrett
(74) *Attorney, Agent, or Firm* — Lowenstein Sandler LLP

(57) ABSTRACT

A substrate flipping device includes a substrate securing assembly, a gripping actuator, and a rotary actuator. The gripping actuator is configured to pneumatically cause the substrate securing assembly to be in an open position to receive a substrate and configured to pneumatically cause the substrate securing assembly to be in a closed position to secure the substrate. The rotary actuator is configured to pneumatically cause the substrate securing assembly to rotate to a flipped position and to pneumatically rotate to a non-flipped position.

20 Claims, 6 Drawing Sheets

SUBSTRATE FLIPPING DEVICE

TECHNICAL FIELD

Embodiments of the present disclosure relate to a flipping device in manufacturing systems, such as substrate processing systems, and in particular to a substrate flipping device in a manufacturing system.

BACKGROUND

In electronics processing systems, such as semiconductor processing systems, objects, such as substrates, are processed. In some systems, an upper and a lower surface of the object is processed.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a substrate flipping device includes a substrate securing assembly, a gripping actuator, and a rotary actuator. The gripping actuator is configured to pneumatically cause the substrate securing assembly to be in an open position to receive a substrate and configured to pneumatically cause the substrate securing assembly to be in a closed position to secure the substrate. The rotary actuator is configured to pneumatically cause the substrate securing assembly to rotate to a flipped position and to pneumatically rotate to a non-flipped position.

In another aspect of the disclosure, a system includes a memory and a processing device coupled to the memory. The processing device is to cause, via actuation of a gripping actuator of a substrate flipping device, a substrate securing assembly of the substrate flipping device to be pneumatically placed in an open position to receive a substrate from a robot of a semiconductor processing system. The processing device is further to cause, via actuation of the gripping actuator, the substrate securing assembly to be pneumatically placed in a closed position to grip the substrate. The processing device is further to cause, via actuation of a rotary actuator of the substrate flipping device, the substrate securing assembly to be pneumatically rotated from a non-flipped position to a flipped position. The substrate is to be removed by the robot from the substrate securing assembly responsive to the substrate securing assembly being in the flipped position and the open position.

In another aspect of the disclosure, a method includes pneumatically causing, via a gripping actuator of a substrate flipping device, a substrate securing assembly of the substrate flipping device to be in an open position to receive a substrate. The method further includes pneumatically causing, via the gripping actuator, the substrate securing assembly to be in a closed position to secure the substrate. The method further includes pneumatically rotating, via a rotary actuator of the substrate flipping device, the substrate securing assembly to a flipped position.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
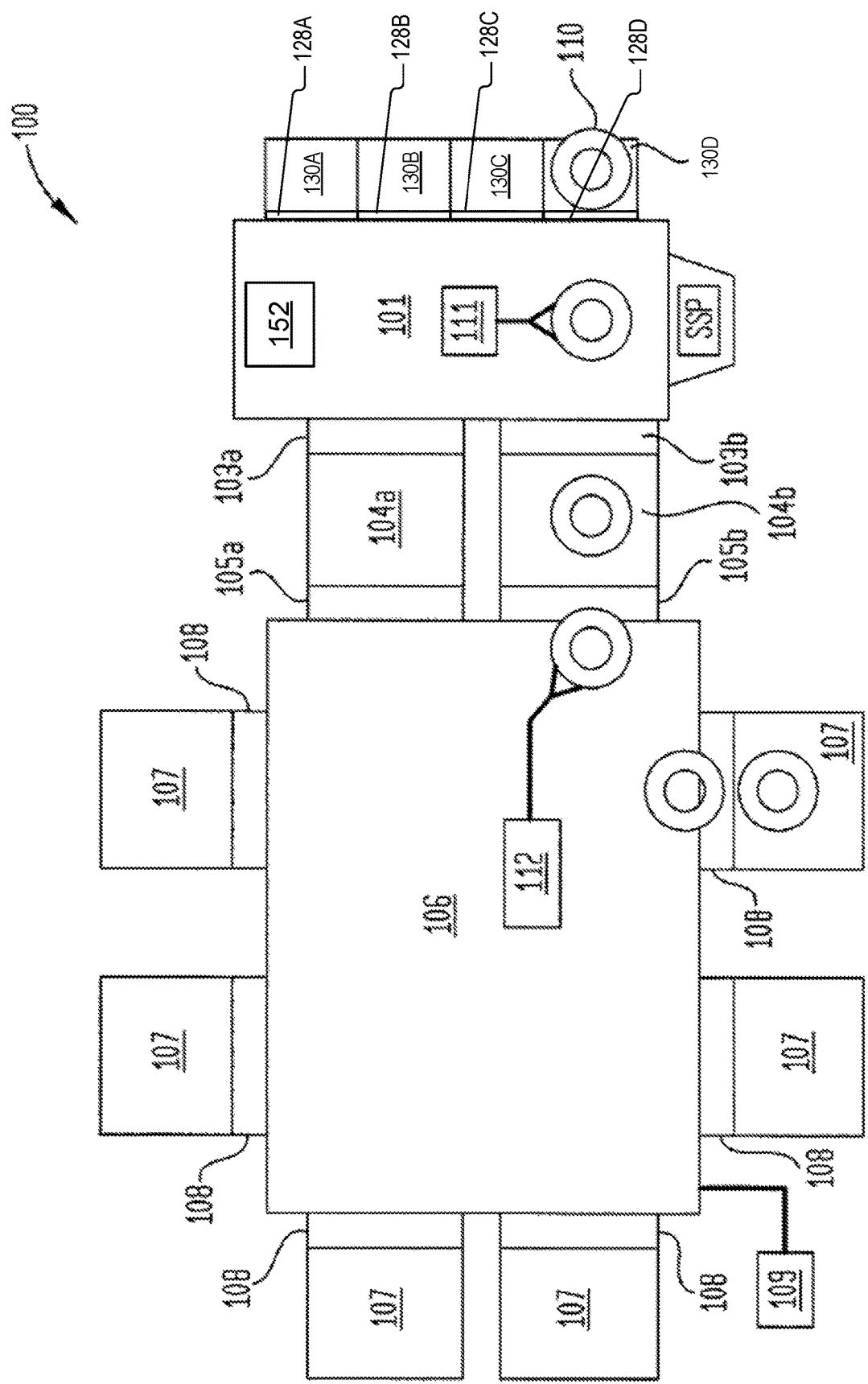
FIG. 1 illustrates a processing system, according to certain embodiments.

Embodiments described herein are related to a substrate flipping device.

In electronics processing systems, such as semiconductor processing systems, objects, such as substrates, are processed. In some systems, an upper and a lower surface of the object is processed. In semiconductor processing systems, a substrate is transported by robot arm, placed in a processing chamber, and an upper surface of the substrate is processed in the processing chamber. To process the lower surface of the substrate, the substrate is to be flipped.

Some conventional systems have a stand-alone device for rotating substrates. The conventional stand-alone device is large and is not usable with many semiconductor processing systems or semiconductor processing systems are to be configured to accommodate the large stand-alone device. The conventional stand-alone device accommodates only one size of substrate, making the device impractical for many semiconductor processing systems. The conventional stand-alone device only accommodates a robot arm approaching from one direction, which increases the amount of room to be allocated to install and use the device. Conventional systems use electronic controls that have an increased complexity of providing rotation of the substrate to a wide range of orientations (e.g., vertical, horizontal, and many intervening diagonal orientations). Some conventional systems fracture substrates (e.g., ultra-thin wafers and substrates).

The devices, systems, and methods disclosed herein provide a substrate flipping device. The substrate flipping device includes a substrate securing assembly, a gripping actuator, and a rotary actuator. In some embodiments, the gripping actuator and the rotary actuator are pneumatic actuators. The gripping actuator pneumatically causes the substrate securing assembly to be in an open position to receive a substrate and pneumatically causes the substrate securing assembly to be in a closed position to secure the substrate. The rotary actuator pneumatically causes the substrate securing assembly to rotate to a flipped position and to pneumatically rotate to a non-flipped position.

Components of the substrate securing assembly are configured to interlock in a first configuration to receive a substrate from one or more first direction and are configured to interlock in a second configuration to receive a substrate from one or more second directions.

Components of the substrate securing assembly form first openings to receive gripping pads to secure a first size of substrate and also form second openings to receive the gripping pads to secure a second size of substrate.

The substrate securing assembly is flexible and includes gripping pads that form a pocket to receive the substrate to be able to handle substrates (e.g., ultra-thin substrates)

without damaging the substrates. The substrate flipping device is configured to be installed within the factory interface, the transfer chamber, a chamber mounted to the factory interface or transfer chamber (e.g., an enclosure system, a front opening unified pod (FOUP), a side-storage pod, etc.), and/or the like.

The devices, systems, and methods disclosed herein have advantages over conventional solutions. In some embodiments, the substrate flipping device is configured to be installed on a load port (e.g., in a FOUP attached to a load port), in a factory interface, in a transfer chamber, and/or the like, making the substrate flipping device more usable with different types of substrate processing systems than conventional rotating systems. In some embodiments, the substrate flipping device accommodates different sizes of substrates, making the substrate flipping device more practical for processing different types of substrates than conventional systems. In some embodiments, the substrate flipping device accommodates a robot arm approaching from different directions, which allows for less room being allocated to install and use the substrate flipping device than conventional systems. In some embodiments, the substrate flipping device has pneumatic actuators that provide a flipped orientation and a non-flipped orientation instead of the increased complexity of electronic controls of conventional systems. In some embodiments, the substrate flipping device has a flexible substrate securing assembly and grip pads that form pockets, making the substrate flipping device less likely to damage substrates than conventional systems.

FIG. 1 illustrates a processing system 100 (e.g., wafer processing system, substrate processing system, semiconductor processing system) according to certain embodiments. The processing system 100 includes a factory interface 101 and load ports 128 (e.g., load ports 128A-D). In some embodiments, the load ports 128A-D are directly mounted to (e.g., seal against) the factory interface 101. Enclosure systems 130 (e.g., cassette, front opening unified pod (FOUP), process kit enclosure system, or the like) are configured to removably couple (e.g., dock) to the load ports 128A-D. Referring to FIG. 1, enclosure system 130A is coupled to load port 128A, enclosure system 130B is coupled to load port 128B, enclosure system 130C is coupled to load port 128C, and enclosure system 130D is coupled to load port 128D. In some embodiments, one or more enclosure systems 130 are coupled to the load ports 128 for transferring wafers and/or other substrates into and out of the processing system 100. In some embodiments, one or more enclosure systems 130 includes (e.g., completely houses, at least partially houses) a substrate flipping device. In some embodiments, a substrate flipping device is mounted directly to a load port 128. In some embodiments, as illustrated, a substrate flipping device 152 is disposed in or mounted to the factory interface 101. Alternatively, or additionally, a substrate flipping device is disposed in or mounted to the transfer chamber 106.

Each of the enclosure systems 130 seal against a respective load port 128. In some embodiments, a first enclosure system 130A is docked to a load port 128A (e.g., for replacing used process kit rings). Once such operation or operations are performed, the first enclosure system 130A is then undocked from the load port 128A, and then a second enclosure system 130 (e.g., a FOUP containing wafers, a FOUP housing a substrate flipping device) is docked to the same load port 128A. In some embodiments, an enclosure system 130 (e.g., enclosure system 130A) is an enclosure system with shelves for aligning carriers and/or process kit rings.

In some embodiments, a load port 128 includes a front interface that forms a vertical opening (or a substantially vertical opening). The load port 128 additionally includes a horizontal surface for supporting an enclosure system 130 (e.g., cassette, process kit enclosure system). Each enclosure system 130 (e.g., FOUP of wafers, process kit enclosure system) has a front interface that forms a vertical opening. The front interface of the enclosure system 130 is sized to interface with (e.g., seal to) the front interface of the load port 128 (e.g., the vertical opening of the enclosure system 130 is approximately the same size as the vertical opening of the load port 128). The enclosure system 130 is placed on the horizontal surface of the load port 128 and the vertical opening of the enclosure system 130 aligns with the vertical opening of the load port 128. The front interface of the enclosure system 130 interconnects with (e.g., clamps to, is secured to, be sealed to) the front interface of the load port 128. A bottom plate (e.g., base plate) of the enclosure system 130 has features (e.g., load features, such as recesses or receptacles, that engage with load port kinematic pin features, a load port feature for pin clearance, and/or an enclosure system docking tray latch clamping feature) that engage with the horizontal surface of the load port 128. The same load ports 128 that are used for different types of enclosure systems 130 (e.g., housing a substrate flipping device, a process kit enclosure system, cassettes that contain wafers, etc.).

In some embodiments, the enclosure system 130 (e.g., process kit enclosure system) includes one or more items of content 110 (e.g., one or more of a process kit ring, an empty process kit ring carrier, a process kit ring disposed on a process kit ring carrier, a placement validation wafer, substrates, etc.). In some examples, the enclosure system 130 is coupled to the factory interface 101 (e.g., via load port 128) to enable automated transfer of a process kit ring on a process kit ring carrier into the processing system 100 for replacement of a used process kit ring.

In some embodiments, the processing system 100 also includes first vacuum ports 103a, 103b coupling the factory interface 101 to respective degassing chambers 104a, 104b. Second vacuum ports 105a, 105b are coupled to respective degassing chambers 104a, 104b and disposed between the degassing chambers 104a, 104b and a transfer chamber 106 to facilitate transfer of wafers and content 110 (e.g., process kit rings, substrates) into the transfer chamber 106. In some embodiments, a processing system 100 includes and/or uses one or more degassing chambers 104 and a corresponding number of vacuum ports 103, 105 (e.g., a processing system 100 includes a single degassing chamber 104, a single first vacuum port 103, and a single second vacuum port 105). The transfer chamber 106 includes a plurality of processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure (e.g., vacuum). Each degassing chamber 104 (e.g., loadlock, pressure chamber) has a first door (e.g., first vacuum port 103) to seal the degassing chamber 104 from the factory interface 101 and a second door (e.g., second vacuum port 105) to seal the degassing chamber 104 from the transfer chamber 106. Content is to be transferred from the factory interface 101 into a degassing chamber 104 while the first door is open and the second door is closed, the first door is to close, the pressure in the degassing chamber 104 is to be reduced to match the transfer chamber 106, the second door is to open, and the content is to be transferred out of the degassing chamber 104. A local center finding (LCF) device is to be used to align the content in the transfer chamber 106 (e.g., before entering a processing chamber 107, after leaving the processing chamber 107).

In some embodiments, the processing chambers 107 include or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. Factory interface robot 111 includes a robot arm, such as a selective compliance assembly robot arm (SCARA) robot. Examples of a SCARA robot include a 2 link SCARA robot, a 3 link SCARA robot, a 4 link SCARA robot, and so on. The factory interface robot 111 includes an end effector on an end of the robot arm. The end effector is configured to pick up and handle specific objects, such as wafers. Alternatively, or additionally, the end effector is configured to handle objects such as a carrier and/or process kit rings (edge rings). The robot arm has one or more links or members (e.g., wrist member, upper arm member, forearm member, etc.) that are configured to be moved to move the end effector in different orientations and to different locations. The factory interface robot 111 is configured to transfer objects between enclosure systems 130 (e.g., cassettes, FOUPs) and degassing chambers 104a, 104b (or load ports).

Transfer chamber 106 includes a transfer chamber robot 112. Transfer chamber robot 112 includes a robot arm with an end effector at an end of the robot arm. The end effector is configured to handle particular objects, such as wafers. In some embodiments, the transfer chamber robot 112 is a SCARA robot, but has fewer links and/or fewer degrees of freedom than the factory interface robot 111 in some embodiments.

A controller 109 controls various aspects of the processing system 100. In some embodiments, the controller 109 includes one or more controllers. The controller 109 is and/or includes a computing device such as a personal computer, a server computer, a programmable logic controller (PLC), a microcontroller, and so on. The controller 109 includes one or more processing devices, which, in some embodiments, are general-purpose processing devices such as a microprocessor, central processing unit, or the like. More particularly, in some embodiments, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some embodiments, the processing device is one or more special-purpose processing devices such as an application specific integrated circuit (ASIC), a field programmable gate array (FPGA), a digital signal processor (DSP), network processor, or the like. In some embodiments, the controller 109 includes a data storage device (e.g., one or more disk drives and/or solid state drives), a main memory, a static memory, a network interface, and/or other components. In some embodiments, the controller 109 executes instructions to perform any one or more of the methods or processes described herein. The instructions are stored on a computer readable storage medium, which include one or more of the main memory, static memory, secondary storage and/or processing device (during execution of the instructions). The controller 109 receives signals from and sends controls to factory interface robot 111 and wafer transfer chamber robot 112 in some embodiments.

FIG. 1 schematically illustrates transfer of content 110 (e.g., a process kit ring coupled to a process kit ring carrier, substrate, etc.) into a processing chamber 107. According to one aspect of the disclosure, content 110 is removed from an enclosure system 130 via factory interface robot 111 located in the factory interface 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 is transferred to a processing chamber 107 though a respective port 108. While not shown for clarity in FIG. 1, transfer of the content 110 includes transfer of a process kit ring disposed on a process kit ring carrier, transfer of an empty process kit ring carrier, transfer of a placement validation wafer, etc. In some embodiments, process kit ring may be removed from the process kit ring carrier, and then the substrate flipping device (e.g., substrate flipping device 152) may flip the process kit ring. The flipped process kit ring may then be placed back onto the process kit ring carrier.

FIG. 1 illustrates one example of transfer of content 110, however, other examples are also contemplated. In some examples, it is contemplated that the enclosure system 130 is coupled to the transfer chamber 106 (e.g., via a load port mounted to the transfer chamber 106). From the transfer chamber 106, the content 110 is to be loaded into a processing chamber 107 by the transfer chamber robot 112. Additionally, in some embodiments, content 110 is loaded in a substrate support pedestal (SSP). In some embodiments, an additional SSP is positioned in communication with the factory interface 101 opposite the illustrated SSP. Processed content 110 (e.g., a used process kit ring) is to be removed from the processing system 100 in reverse of any manner described herein. When utilizing multiple enclosure systems 130 or a combination of enclosure system 130 and SSP, in some embodiments, one SSP or enclosure system 130 is to be used for unprocessed content 110 (e.g., new process kit rings), while another SSP or enclosure system 130 is to be used for receiving processed content 110 (e.g., used process kit rings).

The processing system 100 includes chambers, such as factory interface 101 (e.g., equipment front end module (EFEM)), transfer chamber 106, and adjacent chambers (e.g., load port 128, enclosure system 130, SSP, degassing chamber 104 such as a loadlock, processing chambers 107, or the like) that are adjacent to the factory interface 101 and/or the transfer chamber 106. One or more of the chambers are sealed (e.g., each of the chambers is sealed). The adjacent chambers are sealed to the factory interface 101 and/or the transfer chamber 106. In some embodiments, inert gas (e.g., one or more of nitrogen, argon, neon, helium, krypton, or xenon) is provided into one or more of the chambers (e.g., the factory interface 101, transfer chamber 106, and/or adjacent chambers) to provide one or more inert environments. In some examples, the factory interface 101 is an inert EFEM that maintains the inert environment (e.g., inert EFEM minienvironment) within the factory interface 101 so that users do not need to enter the factory interface 101 (e.g., the processing system 100 is configured for no manual access within the factory interface 101).

In some embodiments, gas flow (e.g., providing inert gas, providing nitrogen, exhausting gas to provide a vacuum environment, etc.) is provided into and/or from one or more chambers (e.g., factory interface 101, transfer chamber 106, adjacent chambers, etc.) of the processing system 100.

In some embodiments, the gas flow is greater than leakage through the one or more chambers to maintain a positive pressure within the one or more chambers. In some embodiments, the exhausted gas flow is greater than leakage through the one or more chambers to maintain a negative pressure within the one or more chambers.

In some embodiments, the inert gas within the factory interface 101 is recirculated. In some embodiments, a portion of the inert gas is exhausted. In some embodiments, the gas flow of non-recirculated gas into the one or more chambers is greater than the exhausted gas flow and the gas leakage to maintain a positive pressure of inert gas within the one or more chambers. In some embodiments, exhausted gas flow out of the one or more chambers is greater than gas leakage (e.g., and gas flow) into the one or more chambers to maintain a negative pressure (e.g., vacuum environment) within the one or more chambers.

In some embodiments, the one or more chambers are coupled to one or more valves and/or pumps to provide the gas flow into and/or out of the one or more chambers. A processing device (e.g., of controller 109) controls the gas flow into and out of the one or more chambers. In some embodiments, the processing device receives sensor data from one or more sensors (e.g., oxygen sensor, moisture sensor, motion sensor, door actuation sensor, temperature sensor, pressure sensor, etc.) and determines, based on the sensor data, the flow rate of inert gas flowing into and/or flow rate of gas flowing out of the one or more chambers.

In some embodiments, a chamber (e.g., enclosure system 130, FOUP, etc.) housing a substrate flipping device is configured to provide gas flow into or out of the chamber. In some examples, gas is exhausted out of the chamber that houses the substrate flipping device to pull inert gas from the factory interface 101 into the chamber and to not contaminate the factory interface 101.

Figure 2A:
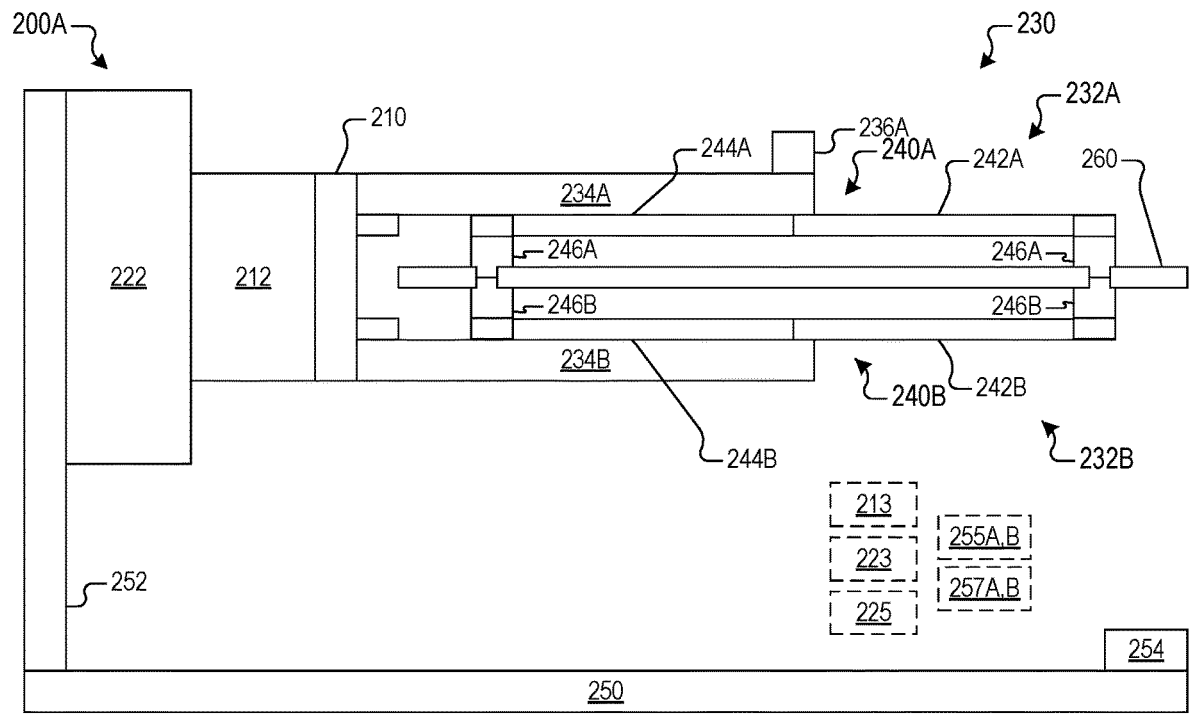
FIGS. 2A-H illustrate substrate flipping devices, according to certain embodiments.
Figure 2B:
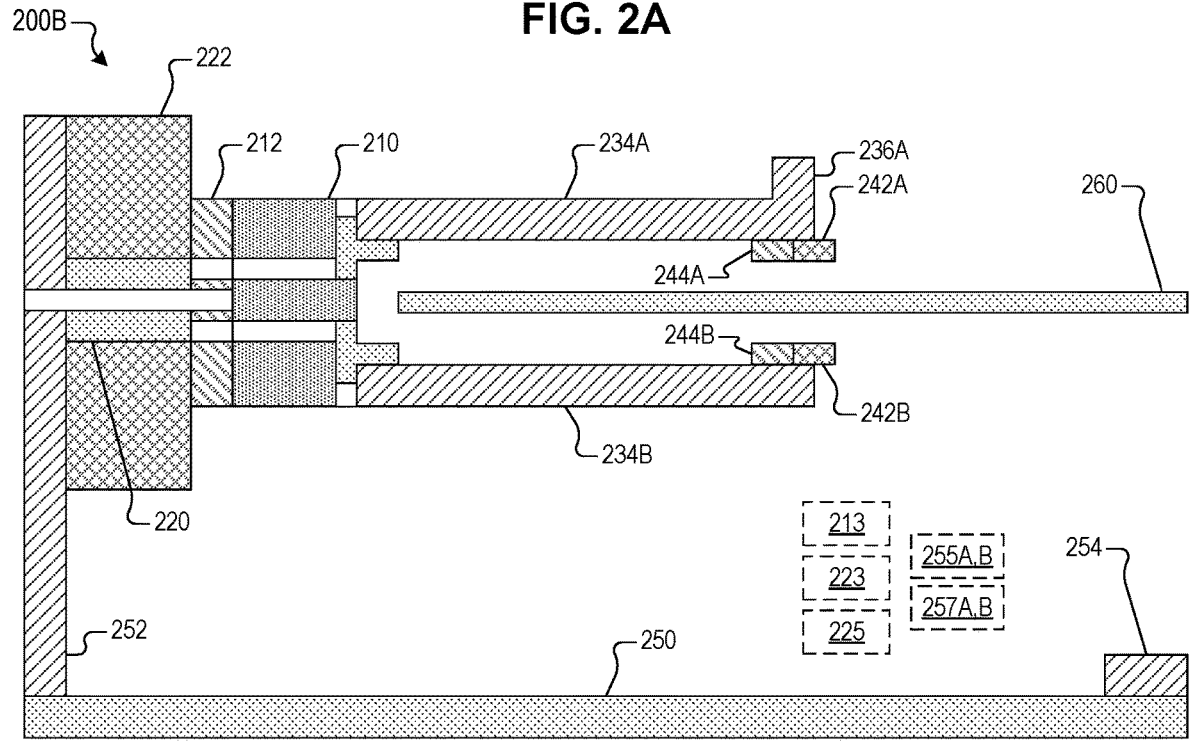
Figure 2C:
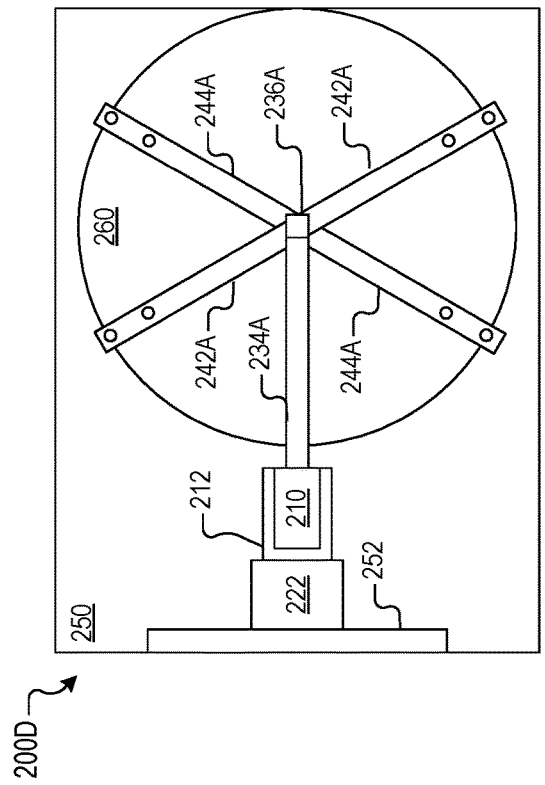
Figure 2D:
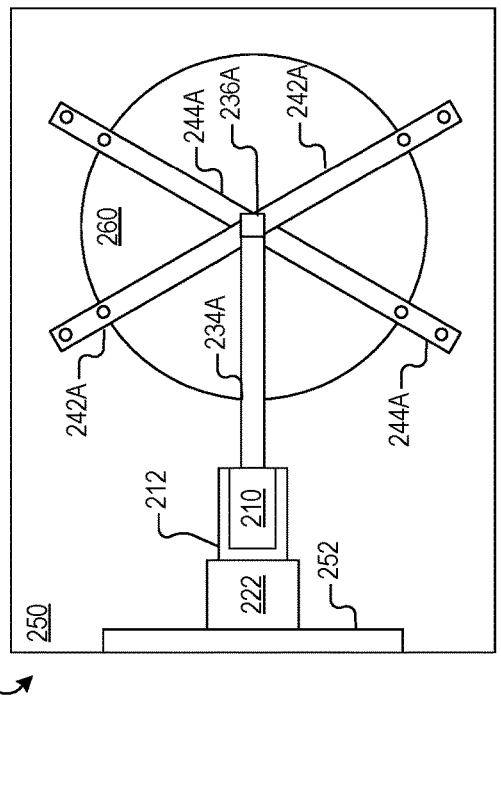
Figure 2E:
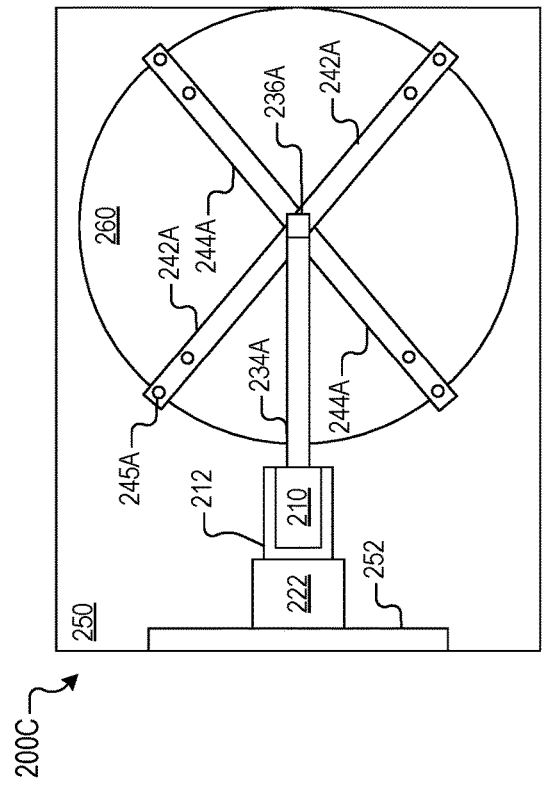
Figure 2F:
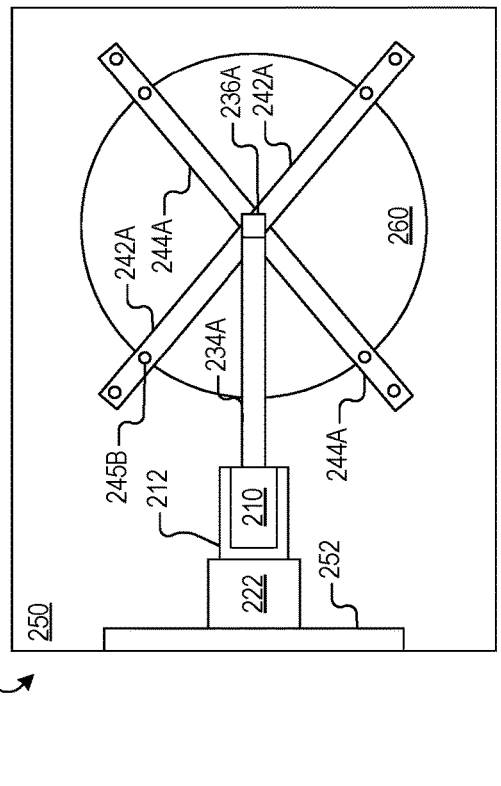
Figure 2G:
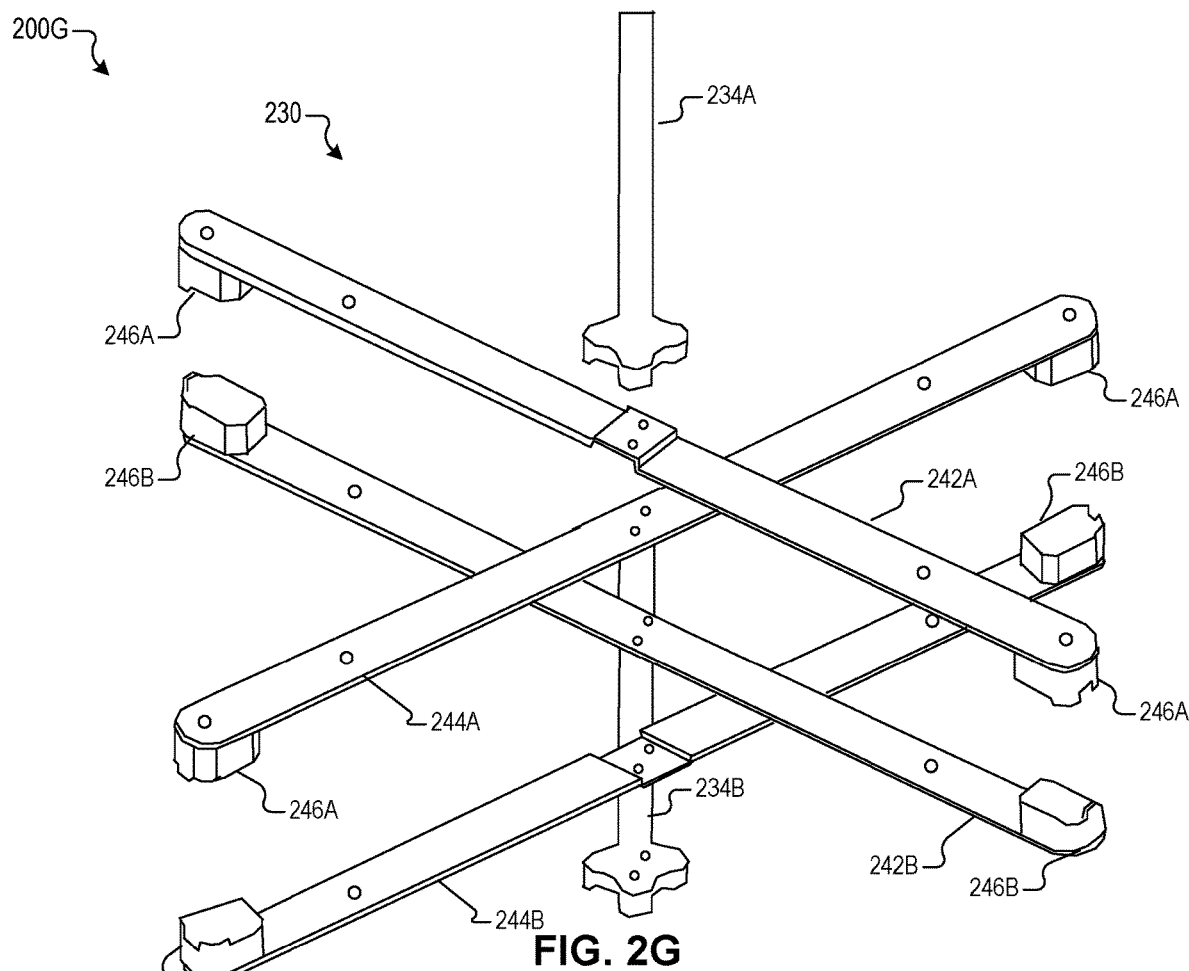
Figure 2H:
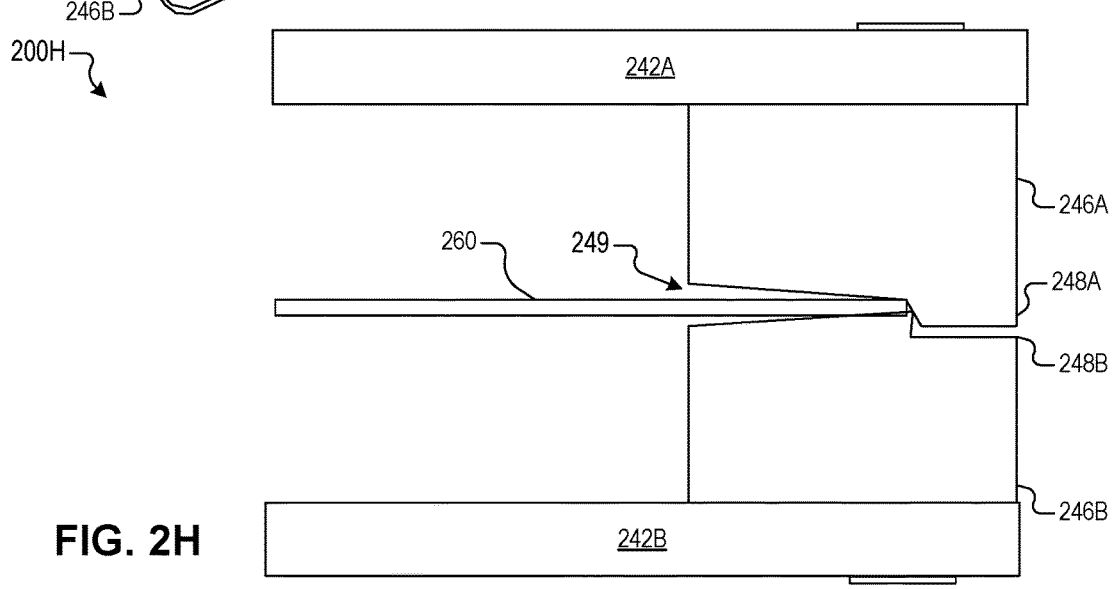

FIGS. 2A-H illustrate substrate flipping devices 200A-H, according to certain embodiments. FIG. 2A is a side view of the substrate flipping device 200A, according to certain embodiments. FIG. 2B is a cross-sectional side view of the substrate flipping device 200B, according to certain embodiments. FIG. 2C is a top view of the substrate flipping device 200C in a first configuration (e.g., allowing a robot arm to approach from the left or the right) and securing a first size of substrate, according to certain embodiments. FIG. 2D is a top view of the substrate flipping device 200D in a second configuration (e.g., allowing a robot arm to approach from the front) and securing a first size of substrate, according to certain embodiments. FIG. 2E is a top view of the substrate flipping device 200E in a first configuration (e.g., allowing a robot arm to approach from the left or the right) and securing a second size of substrate, according to certain embodiments. FIG. 2F is a top view of the substrate flipping device 200F in a second configuration (e.g., allowing a robot arm to approach from the front) and securing a second size of substrate, according to certain embodiments. FIG. 2A is an exploded perspective view of the substrate securing assembly 230 of the substrate flipping device 200A, according to certain embodiments. FIG. 2H is a side view of a portion of the substrate flipping device 200H, according to certain embodiments.

In some embodiments, two or more of substrate flipping devices 200A-H refer to the same substrate flipping device 200. In some embodiments, each of substrate flipping devices 200A-H refer to the same substrate flipping device 200.

The substrate flipping device 200 includes a gripping actuator 210, a rotary actuator 220, and a substrate securing assembly 230. In some embodiments, the substrate flipping device 200 includes a base structure 250, a back structure 252, a pneumatic manifold 222 (e.g., rotary actuator 220 is at least partially disposed in the pneumatic manifold 222), and a gripping bracket 212 (e.g., gripping actuator 210 is at least partially disposed in the gripping bracket 212). In some embodiments, the pneumatic manifold 222 has a pressurized gas inlet and the gripping bracket 212 has a pressurized gas outlet. In some embodiments, one or more portions of the substrate flipping device (e.g., the pneumatic manifold 222) has a damper (e.g., hydraulic damper). In some embodiments, the gripping bracket 212 has one or more mechanical gaskets (e.g., one or more O-rings) to seal channels (e.g., pneumatic feed through, channels from the pneumatic manifold 222 to the gripping actuator 210 via the gripping bracket 212). In some embodiments, the gripping bracket 212 has one or more openings (e.g., drilled holes) to fluidly couple the pressurized gas outlet to the one or more channels (e.g., pneumatic pass through) in the gripping bracket 212.

The substrate securing assembly 230 is configured to secure a substrate 260. One or more components of the substrate securing assembly 230 are flexible (e.g., upper bracket 234A and lower bracket 234B are flexible gripping brackets that deflect to protect substrate 260 from fracturing). The substrate securing assembly 230 includes an upper portion 232A and a lower portion 232B that are configured to be in an open position (e.g., gripping pads 246A of the upper portion 232 not contacting corresponding gripping pads 246B of the lower portion 232B) and are configured to be in a closed position (e.g., gripping pads 246A of the upper portion 232A contacting the corresponding gripping pads 246B of the lower portion 232B). The upper portion 232A and/or the lower portion 232B are actuated by the gripping actuator 210 to be in the closed position and are actuated by the gripping actuator 210 to be in the open position.

The upper portion 232A includes an upper bracket 234A coupled to the gripping actuator 210, an upper x-structure 240A (e.g., including a first upper bar structure 242A and a second upper bar structure 244A) attached to the upper bracket 234, and upper gripping pads 246A removably attached to the upper x-structure 240A.

In some embodiments, the upper portion 232A includes a teaching feature 236A (e.g., feature with a flat upper surface, cylindrical feature, feature with a trapezoidal perimeter, etc.). In some embodiments, the teaching feature 236A is disposed on (e.g., attached to, integral to) the upper bracket 234A. The teaching feature 236A causes the substrate flipping device 200 to be auto-teach capable. In some embodiments, an end effector of a robot arm determines the location of the teaching feature 236A. In some examples, the end effector determines the location of the teaching feature 236A by breaking a light transmission path (e.g., light beam, beam triggering path) between a first light path opening (e.g., fiber emitter coupled to a light source) of the end effector and a second light path opening (e.g., fiber receiver coupled to a light receiver) of the end effector. Responsive to determining the location of the teaching feature 236A, the robot determines the location to place and retrieve the substrate 260 (e.g., on the gripping pads 246). In some embodiments, a teaching feature 236 is located in one or more other locations on the substrate flipping device 200 (e.g., on lower bracket 234B, etc.).

The lower portion 232B includes a lower bracket 234B coupled to the gripping actuator 210, an lower x-structure 240B (e.g., including a first lower bar structure 242B and a second lower bar structure 244B) attached to the lower bracket 234B, and lower gripping pads 246B removably attached to the lower x-structure 240B.

The upper bracket 234A, first upper bar structure 242A, and the second upper bar structure 244A are configured to interlock in a first configuration to receive the substrate 260 from one or more first directions (e.g., left and right) and are configured to interlock in a second configuration to receive the substrate 260 from one or more second directions (e.g., front) that are different from the one or more second directions.

The pneumatic manifold 222 is configured to receive pressurized gas to control the gripping actuator 210 and the rotary actuator 220. The gripper bracket 212 forms channels to provide the pressurized gas from the pneumatic manifold 222 to the gripping actuator 210 (e.g., without routing pneumatic lines).

In some embodiments, the substrate flipping device 200 includes one or more speed control valves 223 configured to control rotation speed of the rotary actuator 220 and to minimize vibration (e.g., reduce potential for induced substrate vibration) of the substrate flipping device 200. In some embodiments, the substrate flipping device 200 includes a pressure regulator 225 configured to adjust system pressure (e.g., to lower gas pressure received to a predetermined operation pressure) to control rotation speed of the rotary actuator 220 and gripping force of the gripping actuator 210 (e.g., both rotary actuator 220 and gripping actuator 210 operate under the same set pressure).

In some embodiments, the substrate flipping device 200 includes one or more first sensors 255A,B (e.g., two sensors), coupled to the rotary actuator 220, configured to provide first sensor data indicative of a first position of the rotary actuator 220 (e.g., flipped position, non-flipped position). In some embodiments, the substrate flipping device 200 includes one or more second sensors 257A,B (e.g., two sensors) coupled to the gripping actuator 210 and configured to provide second sensor data indicative of a second position of the gripping actuator 210 (e.g., closed position, open position, etc.). In some embodiments, the substrate flipping device 200 includes a substrate presence sensor 254 (e.g., ultrasonic sensor, optical sensor) configured to provide third sensor data indicative of presence of the substrate and status of flipping of the substrate 260.

The substrate flipping device 200 is configured to receive one or more different sizes of substrates 260 (e.g., 200 millimeter (mm) and 300 mm). In some embodiments, substrate 260 includes one or more of a glass wafer, a silicon wafer, etc. In some embodiments, the substrate flipping device 200 receives the substrate 260 from a robot (e.g., atmospheric robot blade) and flips the substrate 260 180 degrees (e.g., bottom side becomes top side). In some embodiments, the rotation occurs along the X-axis or Y-axis and takes into account robot entry and substrate placement. In some embodiments, the substrate flipping device 200 has a four-point edge grip to secure the substrate 260 (e.g., in the wafer exclusion zone of less than 2 mm). In some embodiments, the substrate thickness is about 0.3 mm to about 2.5 mm. In some embodiments, the robot substrate hand-off is along the axis of substrate rotation or perpendicular to the axis of rotation. In some embodiments, there are no moving components (e.g., wires, tubes, manual adjusters, etc. above and below the substrate plane. In some embodiments, the pneumatic actuators exhaust 213 away from the substrate plane (e.g., below or behind barrier of the enclosure system).

In some embodiments, the gripper actuator 210 receives pneumatic pressure as input and outputs gripping and open motion (e.g., open position and closed position). The controls of the gripper actuator 210 are pressure and exhaust flow control. In some embodiments, the rotary actuator 220 receives pneumatic pressure as input and outputs rotation motion (e.g., flipped position and non-flipped position, 0 degree position and 180 degree position, etc.). The controls of the rotary actuator 220 are pressure, exhaust flow control, shock absorbers, and end position.

The sensor 254 (e.g., ultrasonic sensor) receives input of electric voltage and outputs on or off. The control of the sensor 254 is to teach distance. The gripper magnetic switch (e.g., of the gripper actuator 210) has an input of electric voltage and has an output of on and off. The rotary magnetic switch (e.g., of the rotary actuator 220) has an input of electric voltage and has an output of on and off.

Referring to FIGS. 2C-F, in some embodiments, the upper x-structure 240A (e.g., including a first upper bar structure 242A and a second upper bar structure 244A) and the lower x-structure 240B (e.g., including a first lower bar structure 242B and a second lower bar structure 244B) form first openings 245A to receive the upper gripping pads 246A and the lower gripping pads 246B to secure a first size of substrate 260 (e.g., see FIGS. 2C-D) and also form second openings 245B to receive the upper gripping pads 246A and the lower gripping pads 246B to secure a second size of substrate 260 (e.g., see FIGS. 2E-F). In some examples, the first size of substrate is 300 millimeters (mm) and the second size of substrate is 200 mm. In some embodiments, the substrate flipping device 200 is configured to secure two or more different sizes of substrates 260.

In some embodiments, the substrate flipping device 200 is manually adjusted, adjusted by a robot, and/or performs self-adjustments to secure a specific size of substrate 260 and/or to accommodate one or more approach directions by a robot.

Referring to FIG. 2G, in some embodiments, the upper bracket 234A, first upper bar structure 242A, and the second upper bar structure 244A attach to each other (e.g., via a fastener, such as a bolt, screw, etc.) and the lower bracket 234B, first lower bar structure 242B, and the second lower bar structure 244B attach to each other (e.g., via a fastener, such as a bolt, screw, etc.). In some embodiments, the upper bracket 234A, first upper bar structure 242A, and the second upper bar structure 244A attach to each other in a particular configuration and the lower bracket 234B, first lower bar structure 242B, and the second lower bar structure 244B attach to each other in the same configuration so that a robot arm approaches the substrate securing assembly 230 from one or more corresponding directions. In some embodiments, the particular configuration provides a larger opening in the front of the substrate securing assembly 230 so that the robot arm approaches the substrate securing assembly 230 from the front to place the substrate 260 and remove the substrate 260. In some embodiments, the particular configuration provides larger openings on the left and the right of the substrate securing assembly 230 so that the robot arm approaches the substrate securing assembly 230 from the left and/or the right to place the substrate 260 and remove the substrate 260. In some embodiments, the substrate securing assembly is configured to be fastened in the first configuration (e.g., larger opening in the front) and is configured to be re-fastened in the second configuration (e.g., larger opening on the left and the right).

In some embodiments, the components of the substrate securing assembly 230 are flexible to allow slight deflection to manage on the substrate 260. In some embodiments, first and second bar structures 242 and 244 of the substrate securing assembly 230 interlock and assemble one way and also allow mounting in two different configurations to allow robot approach from two different directions.

In some embodiments, the substrate securing assembly 230 has alternate mounting locations for the first and second bar structures 242 and 244.

The gripping pads 246 attach to the first and second bar structures 242 and 244. Corresponding gripping pads 246 interlock to keep the substrate 260 in the pocket formed by the interlocked gripping pads 246. The geometry of the gripping pads 246 contact the substrate 260 within an exclusion zone and force is managed via the flexible first and second bar structures 242 and 244.

In some embodiments, the substrate securing assembly 230 is controlled (e.g., placed in an open position, closed position, flipped position, non-flipped position) via pneumatic controls (e.g., providing pressurized gas to the rotary actuator 220 and/or gripping actuator 210). Use of pneumatic controls simplifies operation by allowing (e.g., only allowing) two positions of flipped position and non-flipped position (e.g., since intermediate positions are not required). In some embodiments, the substrate securing assembly 230 is controlled (e.g., placed in an open position, closed position, flipped position, non-flipped position) via electronic controls (e.g., servo control).

In some embodiments, the substrate flipping device 200 is a stand-alone device. In some embodiments, the substrate flipping device 200 is configured to handle ultra-thin wafers and ultra-thin substrates without fracture.

In some embodiments, one or more components of the substrate securing assembly 230 have error-prevention features (e.g., poka-yoke features, mistake-proofing features) for easy assembly. In some examples, bar structure 242A has a recess to receive the bar structure 244A and bar structure 244B has a recess to receive bar structure 242B.

Referring to FIG. 2H, the gripping pad 246A is connected to first upper bar structure 242A (e.g., via a fastener through an opening formed by the first upper bar structure 242A) and gripping pad 246B is connected to first lower bar structure 242B (e.g., via a fastener through an opening formed by the first lower bar structure 242B). In some embodiments, the gripping pads 246A-B have interlocking features 248A-B (e.g., protrusion and recess). Upon being in a closed position (e.g., as reflected in FIG. 2H), the gripping pads 246A-B form a pocket 249 to receive (e.g., secure) the substrate 260. The interlocking features 248A-B form a locking feature to contain the substrate 260 during rotation. In some embodiments, the substrate 260 is maintained in the pocket (e.g., even without sufficient gripping force) via the interlocking features on the gripping pads 246. In some embodiments, the substrate flipping device 200 is used by robot arms that do not have z-movement.

Figure 3:
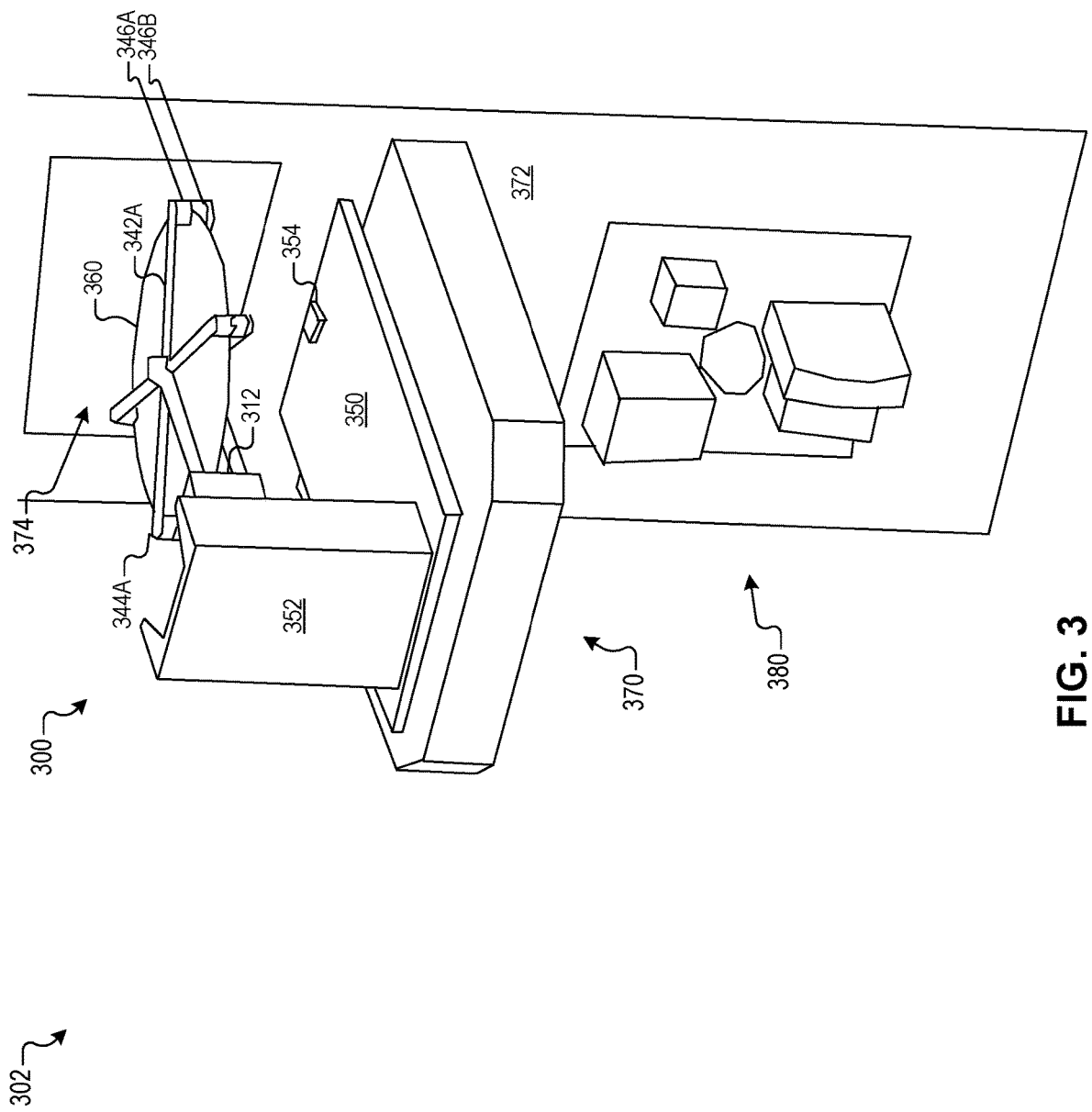
FIG. 3 illustrates a substrate flipping device disposed on a load port, according to certain embodiments.

FIG. 3 illustrates a system 302 (e.g., substrate processing system 100 of FIG. 1) including a substrate flipping device 300 (e.g., substrate flipping device 200A-G of FIGS. 2A-G) disposed on a load port 328 (e.g., load port 128 of FIG. 1), according to certain embodiments. In some embodiments, features of FIG. 3 that have similar reference numbers as those of one or more other FIGS. have the same or similar structure and/or functionality.

The substrate flipping device 300 includes a base 350, a back structure 352, a gripping bracket 312, bar structures 342 and 344, and gripping pads 346A-B to secure a substrate 360, and a substrate presence sensor 354.

System 302 includes a load port 370 mounted on a panel 372. In some embodiments, the panel 372 separates the load port from the factory interface (e.g., factory interface 101 of FIG. 1) or transfer chamber (e.g., transfer chamber 106 of FIG. 1). In some embodiments, the panel 372 is part of the factory interface or the transfer chamber. The panel 372 forms an opening 374 to transfer a substrate from the system 302 (e.g., factory interface or transfer chamber) in the substrate flipping device 300 and to transfer the flipped substrate from the substrate flipping device 300 into the system 302.

A substrate flipping device 300 is disposed on the load port 370. In some embodiments, the substrate flipping device 300 is disposed in an enclosure system (e.g., FOUP) that seals against the panel 372. In some embodiments, the opening 374 of the panel 372 is configured to be sealed to maintain a sealed environment in the system 302 (e.g., factory interface or transfer chamber). Responsive to sealing the enclosure system of the substrate flipping device 300 against the panel 372 (e.g., and providing an environment in the enclosure system similar to that in the sealed environment of the system 302), the opening 374 is unsealed so that the sealed environment in the system 302 (e.g., factory interface or transfer chamber) includes the sealed environment within the enclosure system that houses the substrate flipping device 300. In some embodiments, the sealed environment includes one or more of a compressed dry air, inert gas (e.g., nitrogen), vacuum (e.g., negative pressure), positive pressure, etc. In some embodiments, gas is exhausted from the enclosure system that houses the substrate flipping device 300 to outside of the system 302 to pull gas from the sealed environment of the system 302 (e.g., factory interface or transfer chamber) into the enclosure system and to exhaust contaminants from the enclosure system out of the system 302.

In some embodiments, the pressurized gas used by the substrate flipping device matches is selected based on the type of gas in the sealed environment. In some examples, for an inert sealed environment, the substrate flipping device uses a pressurized inert gas (e.g., nitrogen). In some examples, for a sealed environment that uses air (e.g., compressed dry air (CDA)), the substrate flipping device uses pressurized air (e.g., CDA).

In some embodiments, a controller 380 is disposed proximate the substrate flipping device 300. In some embodiments, the controller 380 is disposed on the panel 372 (e.g., outside of the sealed environment of the factory interface or transfer chamber) under the load port 370. In some embodiments, a cover is placed over the controller 380.

In some embodiments, the controller 380 includes Beckhoff slices for feedback of the substrate flipping device 300. In some embodiments, the controller 380 provides control of pneumatic actuators (e.g., gripper actuator 210 and rotary actuator 220 of FIG. 2) via the Beckhoff slices, sending sensor data (e.g., digital output (DO)) to the pneumatic manifold (e.g. pneumatic manifold 222 of FIG. 2). In some embodiments, the controller 380 has a Beckhoff coupler with digital input (DI)/DO slices.

In some embodiments controller 380 (e.g., Beckhoff) performs the actions shown in Table 1.

TABLE 1

| | | Controller DI terminal | | | | |
|---|---|---|---|---|---|---|
| | | 1<br>Open gripper switch | 2<br>Closed gripper switch | 3<br>0 degree switch | 4<br>180 degree switching | 5<br>Substrate presence switch |
| | Action | | | | | |
| Process 1 | Initiate Hand-off Substrate | On | Off | On | Off | Off |
| | Successful Hand-off | On | Off | On | Off | On |
| | Initiate Clamp Substrate | On | Off | On | Off | On |
| | Successful Clamp | Off | On | On | Off | On |
| | Initiate Rotate Substrate | Off | On | On | Off | On |
| | Successful Rotate | Off | On | Off | On | On |
| | Initiate Unclamp Substrate | Off | On | Off | On | On |
| | Successful Unclamp | On | Off | Off | On | On |
| | Initiate Retrieve Substrate | On | Off | Off | On | On |
| | Successful Retrieve | On | Off | Off | On | Off |
| **Flipping from 0 degree to 180 degree (hand-off at 0 degree, retrieve at 180 degree) | | | | | | |
| Process 2 | Initiate Hand-off Substrate | On | Off | Off | On | Off |
| | Successful Hand-off | On | Off | Off | On | On |
| | Initiate Clamp Substrate | On | Off | Off | On | On |
| | Successful Clamp | Off | On | Off | On | On |
| | Initiate Rotate Substrate | Off | On | Off | On | On |
| | Successful Rotate | Off | On | On | Off | On |
| | Initiate Unclamp Substrate | Off | On | On | Off | On |
| | Successful Unclamp | On | Off | On | Off | On |
| | Initiate Retrieve Substrate | On | Off | On | Off | On |
| | Successful Retrieve | On | Off | On | Off | Off |
| **Flipping from 180 degree to 0 degree (hand-off at 180 degree, retrieve at 0 degree) | | | | | | |

In some embodiments, the controller 380 controls valves as shown in Table 2.

TABLE 2

| | Action | Valve 1A | Valve 1B | Valve 2A | Valve 2B |
|---|---|---|---|---|---|
| Process 1 | Initiate Hand-off Substrate | Open | — | — | Open |
| | Initiate Clamp Substrate | — | Open | — | Open |
| | Initiate Rotate Substrate | — | Open | Open | — |
| | Initiate Unclamp Substrate | Open | — | Open | — |
| | Initiate Retrieve Substrate | Open | — | — | Open |
| **Flipping from 0 degree to 180 degree (hand-off at 0 degree, retrieve at 180 degree) | | | | | |
| Process 2 | Initiate Hand-off Substrate | Open | — | Open | — |
| | Initiate Clamp Substrate | — | Open | Open | — |
| | Initiate Rotate Substrate | — | Open | — | Open |
| | Initiate Unclamp Substrate | Open | — | — | Open |
| | Initiate Retrieve Substrate | Open | — | — | Open |
| **Flipping from 180 degree to 0 degree (hand-off at 180 degree, retrieve at 0 degree) | | | | | |

In some embodiments, one or more portions of the substrate flipping device 300 (e.g., rotary actuator and gripping actuator) are located within an enclosure (e.g., in addition to the enclosure system around the substrate flipping device 300) to capture any contaminants (e.g., particles).

Figure 4:
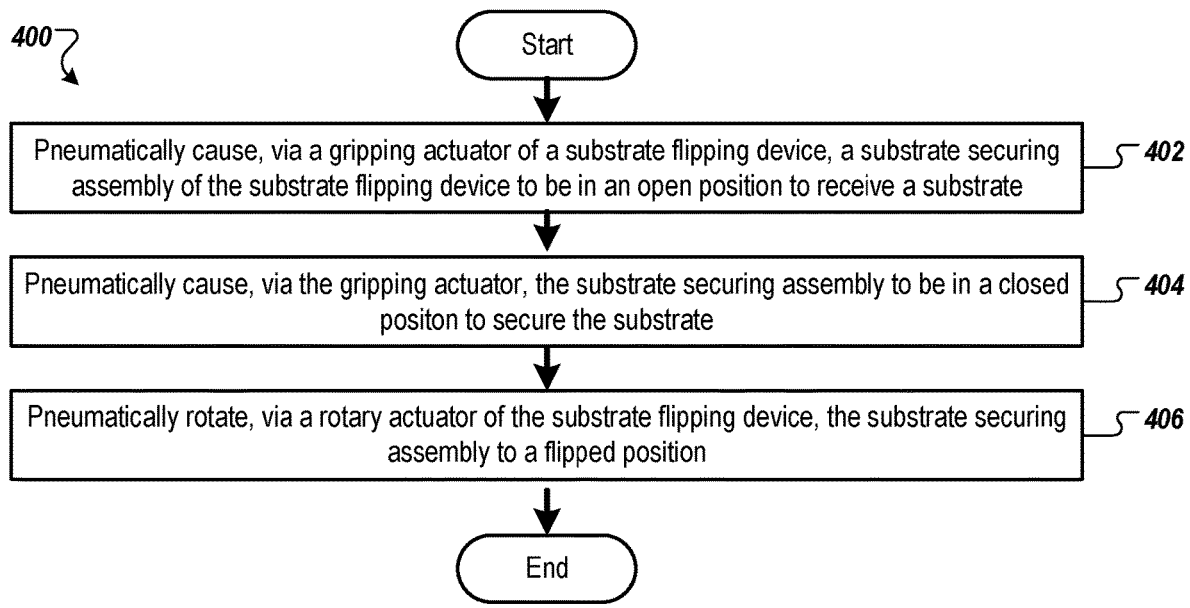
FIG. 4 illustrates a method of using a substrate flipping device, according to certain embodiments.

FIG. 4 illustrates a method 400 of using a substrate flipping device (e.g., one or more of substrate flipping devices 200A-G of FIGS. 2A-G and/or 300 of FIG. 3), according to certain embodiments. Method 400 is performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 400 is performed, in part, by controller device (e.g., controller device 190 of FIG. 1 and/or controller 380 of FIG. 3). In some embodiments, method 400 is performed, in part, by a substrate flipping device (e.g., one or more of substrate flipping devices 200A-G of FIGS. 2A-G and/or 300 of FIG. 3). In some embodiments, a non-transitory storage medium stores instructions that when executed by a processing device (e.g., of controller device 190, controller 380, etc.) cause the processing device to perform method 400.

For simplicity of explanation, method 400 is depicted and described as a series of operations. However, operations in accordance with this disclosure can occur in various orders and/or concurrently and with other operations not presented and described herein. Furthermore, in some embodiments, not all illustrated operations are be performed to implement method 400 in accordance with the disclosed subject matter. In addition, those skilled in the art will understand and appreciate that method 400 could alternatively be represented as a series of interrelated states via a state diagram or events.

At block 402 of method 400, processing logic pneumatically causes, via a gripping actuator of a substrate flipping device (e.g., by sending a first signal to the substrate flipping device), a substrate securing assembly of the substrate flipping device to be in an open position to receive a substrate. An end effector of a robot arm may place a substrate in a first orientation on or in a pocket or substrate support of the substrate securing assembly.

In some embodiments, portions of the substrate securing assembly are disposed (e.g., manually configured, automatically configured, interlocked, etc.) in a configuration to receive a substrate from one or more directions (e.g., only straight on, only from the left or from the right) via a robot. In some embodiments, portions of the substrate securing assembly are changed from a first configuration corresponding to receiving a substrate from one or more first directions to a second configuration (e.g., manually, automatically) to receive a substrate from one or more second directions that are different from the one or more first directions. The substrate securing assembly is configured to accommodate robots from different angles, positions, and/or directions. In some embodiments, the substrate securing assembly is manually adjusted (e.g., at least partially disassembled and then reassembled) to be in different configurations. In some embodiments, the substrate securing assembly is automatically adjusted. In some embodiments, one or more portions of the substrate securing assembly has features (e.g., protrusions, recesses, error-prevention features, etc.) for interlocking the portions of the substrate securing assembly in the first configuration to receive a substrate in one or more first directions and for interlocking the portions of the substrate securing assembly in the second configuration to receive a substrate in one or more second directions.

At block 404, processing logic pneumatically causes, via the gripping actuator (e.g., by sending a second signal to the substrate flipping device), the substrate securing assembly to be in a closed position to secure the substrate.

At block 406, processing logic pneumatically causes, via a rotary actuator of the substrate flipping device (e.g., by sending a third signal to the substrate flipping device), the substrate securing assembly to a flipped position.

In some embodiments, the processing logic causes, via a pressure regulator of the substrate flipping device, system pressure to be adjusted to control rotation speed of the rotary actuator and gripping force of the gripping actuator. In some embodiments, the processing logic causes a pneumatic manifold of the substrate flipping device to receive pressurized gas to control the gripping actuator and the rotary actuator. In some embodiments, the processing logic causes, via one or more speed control valves of the substrate flipping device, rotation speed of the rotary actuator to be controlled.

In some embodiments, the processing logic receives, from a first sensor coupled to the rotary actuator, first sensor data indicative of a first position of the rotary actuator. In some embodiments, the processing logic receives, from a second sensor coupled to the gripping actuator, first sensor data indicative of a second position of the gripping actuator.

In some embodiments, the processing logic receives, from a substrate presence sensor, third sensor data indicative of presence of the substrate and status of flipping of the substrate.

The robot arm may retrieve the flipped substrate on the end effector of the robot arm. Alternatively, a second robot arm having a different position and/or orientation relative to the substrate flipping device may retrieve the flipped substrate on an end effector of the second robot arm. In some embodiments, the flipped position (e.g., corresponding to a second robot arm) has one or more of a different angle, different orientation, and/or the like than the non-flipped position (e.g., corresponding to the robot arm that placed the substrate on the substrate flipping device).

Examples described herein also relate to an apparatus for performing the methods described herein. In some embodiments, this apparatus is specially constructed for performing the methods described herein, or includes a general purpose computer system selectively programmed by a computer program stored in the computer system. In some embodiments, the computer program is stored in a computer-readable tangible storage medium.

The methods and illustrative examples described herein are not inherently related to any particular computer or other apparatus. In some embodiments, the various general purpose systems are used in accordance with the teachings described herein, or a more specialized apparatus is constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure are practiced without these specific details. In other instances, well-known components or methods are not described in detail or are presented in simple block diagram format in order to avoid unnecessarily obscuring the present disclosure. Thus, the specific details set forth are merely exemplary. Particular implementations vary from these exemplary details and are still contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

The terms "over," "under," "between," "disposed on," and "on" as used herein refer to a relative position of one material layer or component with respect to other layers or components. In some examples, one layer disposed on, over, or under another layer is directly in contact with the other layer or has one or more intervening layers. In some examples, one layer disposed between two layers is directly in contact with the two layers or has one or more intervening layers. Similarly, in some examples, one feature disposed between two features is in direct contact with the adjacent features or has one or more intervening layers.

Although the operations of the methods herein are shown and described in a particular order, in some embodiments, the order of operations of each method is altered so that certain operations are performed in an inverse order so that certain operations are performed, at least in part, concurrently with other operations. In another embodiment, instructions or sub-operations of distinct operations are in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate flipping device comprising:
a substrate securing assembly having an upper bracket and a lower bracket configured to secure a substrate;
a first pneumatic actuator configured to pneumatically cause the substrate securing assembly to be in an open position to receive the substrate, wherein the first pneumatic actuator is configured to pneumatically cause the substrate securing assembly to be in a closed position to secure the substrate in a substrate plane; and
a second pneumatic actuator configured to pneumatically cause the substrate securing assembly to rotate to a flipped position and to pneumatically rotate to a non-flipped position, wherein the first pneumatic actuator and the second pneumatic actuator are configured to pneumatically exhaust away from the substrate plane via an exhaust flow control of at least one of the first pneumatic actuator or the second pneumatic actuator.

2. The substrate flipping device of claim 1 further comprising:
a pneumatic manifold to receive pressurized gas to control the first pneumatic actuator and the second pneumatic actuator, wherein the second pneumatic actuator is disposed within the pneumatic manifold; and
a gripper bracket forming channels to provide the pressurized gas from the pneumatic manifold to the first pneumatic actuator, wherein the first pneumatic actuator is at least partially disposed within the gripper bracket.

3. The substrate flipping device of claim 1 further comprising:
one or more speed control valves configured to control rotation speed of the second pneumatic actuator and to minimize vibration of the substrate flipping device; and
a pressure regulator configured to adjust system pressure to control rotation speed of the second pneumatic actuator and gripping force of the first pneumatic actuator.

4. The substrate flipping device of claim 1 further comprising:
a first sensor, coupled to the second pneumatic actuator, configured to provide first sensor data indicative of a first position of the second pneumatic actuator;
a second sensor coupled to the first pneumatic actuator and configured to provide second sensor data indicative of a second position of the first pneumatic actuator; and
a substrate presence sensor configured to provide third sensor data indicative of presence of the substrate and status of flipping of the substrate.

5. The substrate flipping device of claim 1, wherein the substrate securing assembly comprises:
an upper portion comprising:
the upper bracket, wherein the upper bracket is coupled to the first pneumatic actuator;
a first upper bar structure and a second upper bar structure attached to the upper bracket, the first upper bar structure and the second upper bar structure forming an upper x-structure; and
upper gripping pads removably attached to the upper x-structure; and a lower portion comprising:
the lower bracket, wherein the lower bracket is coupled to the first pneumatic actuator;
a first lower bar structure and a second lower bar structure attached to the lower bracket, the first lower bar structure and the second lower bar structure forming a lower x-structure; and
lower gripping pads removably attached to the lower x-structure, the upper gripping pads and the lower gripping pads configured to interlock in the closed position to grip the substrate.

6. The substrate flipping device of claim 5, wherein:
the upper bracket, the first upper bar structure, and the second upper bar structure are configured to interlock in a first configuration to receive the substrate from one or more first directions and are further configured to interlock in a second configuration to receive the substrate from one or more second directions that are different from the one or more first directions.

7. The substrate flipping device of claim 5, wherein:
the upper x-structure and the lower x-structure form first openings to receive the upper gripping pads and the lower gripping pads to secure a first size of substrate; and
the upper x-structure and the lower x-structure form second openings to receive the upper gripping pads and the lower gripping pads to secure a second size of substrate.

8. A system comprising:
a memory; and
a processor coupled to the memory, the processor to:
cause, via actuation of a first pneumatic actuator an upper bracket and a lower bracket to be pneumatically-placed in an open position to receive a substrate from a robot of a semiconductor processing system;
cause, via actuation of the first pneumatic actuator, the upper bracket and the lower bracket to be pneumatically-placed in a closed position to grip the substrate in a substrate plane; and
cause, via actuation of a second pneumatic actuator, the upper bracket and the lower bracket to be pneumatically rotated from a non-flipped position to a flipped position, wherein the first pneumatic actuator and the second pneumatic actuator are configured to pneumatically exhaust away from the substrate plane via an exhaust flow control of at least one of the first pneumatic actuator or the second pneumatic actuator, and wherein the substrate is to be removed by the robot from the upper bracket and the lower bracket responsive to the upper bracket and the lower bracket being in the flipped position and the open position.

9. The system of claim 8, wherein the processor is further to cause a pneumatic manifold to receive pressurized gas to control the first pneumatic actuator and the second pneumatic actuator, wherein the second pneumatic actuator is disposed within the pneumatic manifold, wherein a gripper bracket forms channels to provide the pressurized gas from the pneumatic manifold to the first pneumatic actuator, wherein the first pneumatic actuator is at least partially disposed within the gripper bracket.

10. The system of claim 8, wherein the processor is further to:
cause, via one or more speed control valves, rotation speed of the second pneumatic actuator to be controlled and vibration to be reduced; and cause, via a pressure regulator, system pressure to be adjusted to control rotation speed of the second pneumatic actuator and gripping force of the first pneumatic actuator.

11. The system of claim 8, wherein the processor is further to:
receive, from a first sensor coupled to the second pneumatic actuator, first sensor data indicative of a first position of the second pneumatic actuator;
receive, from a second sensor coupled to the first pneumatic actuator, second sensor data indicative of a second position of the first pneumatic actuator; and
receive, from a substrate presence sensor, third sensor data indicative of presence of the substrate and status of flipping of the substrate.

12. The system of claim 8 further comprising:
an upper portion comprising:
the upper bracket, wherein the upper bracket is coupled to the first pneumatic actuator;
a first upper bar structure and a second upper bar structure attached to the upper bracket, the first upper bar structure and the second upper bar structure forming an upper x-structure; and
upper gripping pads removably attached to the upper x-structure; and
a lower portion comprising:
the lower bracket, wherein the lower bracket is coupled to the first pneumatic actuator;
a first lower bar structure and a second lower bar structure attached to the lower bracket, the first lower bar structure and the second lower bar structure forming a lower x-structure; and
lower gripping pads removably attached to the lower x-structure, the upper gripping pads and the lower gripping pads configured to interlock in the closed position to grip the substrate.

13. The system of claim 12, wherein:
the upper bracket, the first upper bar structure, and the second upper bar structure are configured to interlock in a first configuration to receive the substrate from one or more first directions and are further configured to interlock in a second configuration to receive the substrate from one or more second directions that are different from the one or more first directions.

14. The system of claim 12, wherein:
the upper x-structure and the lower x-structure form first openings to receive the upper gripping pads and the lower gripping pads to secure a first size of substrate; and
the upper x-structure and the lower x-structure form second openings to receive the upper gripping pads and the lower gripping pads to secure a second size of substrate.

15. A method comprising:
pneumatically causing, via a first pneumatic actuator of a system, an upper bracket and a lower bracket configured to secure a substrate to be in an open position to receive the substrate;
pneumatically causing, via the first pneumatic actuator, the upper bracket and the lower bracket to be in a closed position to secure the substrate in a substrate plane; and
pneumatically rotating, via a second pneumatic actuator of the system, the upper bracket and the lower bracket to a flipped position, wherein the first pneumatic actuator and the second pneumatic actuator are configured to pneumatically exhaust away from the substrate plane via an exhaust flow control of at least one of the first pneumatic actuator or the second pneumatic actuator.

16. The method of claim 15 further comprising causing a pneumatic manifold of the system to receive pressurized gas to control the first pneumatic actuator and the second pneumatic actuator, wherein the second pneumatic actuator is disposed within the pneumatic manifold, wherein a gripper bracket forms channels to provide the pressurized gas from the pneumatic manifold to the first pneumatic actuator, wherein the first pneumatic actuator is at least partially disposed within the gripper bracket.

17. The method of claim 15 further comprising:
causing, via one or more speed control valves, rotation speed of the second pneumatic actuator to be controlled and vibration of the system to be reduced; and
causing, via a pressure regulator, system pressure to be adjusted to control rotation speed of the second pneumatic actuator and gripping force of the first pneumatic actuator.

18. The method of claim 15 further comprising:
receiving, from a first sensor coupled to the second pneumatic actuator, first sensor data indicative of a first position of the second pneumatic actuator;
receiving, from a second sensor coupled to the first pneumatic actuator, second sensor data indicative of a second position of the first pneumatic actuator; and
receiving, from a substrate presence sensor, third sensor data indicative of presence of the substrate and status of flipping of the substrate.

19. The method of claim 15, wherein the system comprises:
an upper portion comprising:
the upper bracket, wherein the upper bracket is coupled to the first pneumatic actuator;
a first upper bar structure and a second upper bar structure attached to the upper bracket, the first upper bar structure and the second upper bar structure forming an upper x-structure; and
upper gripping pads removably attached to the upper x-structure; and
a lower portion comprising:
the lower bracket, wherein the lower bracket is coupled to the first pneumatic actuator;
a first lower bar structure and a second lower bar structure attached to the lower bracket, the first lower bar structure and the second lower bar structure forming a lower x-structure; and
lower gripping pads removably attached to the lower x-structure, the upper gripping pads and the lower gripping pads configured to interlock in the closed position to grip the substrate.

20. The method of claim 19, wherein:
the upper bracket, the first upper bar structure, and the second upper bar structure are configured to interlock in a first configuration to receive the substrate from one or more first directions and are further configured to interlock in a second configuration to receive the substrate from one or more second directions that are different from the one or more first directions;
the upper x-structure and the lower x-structure form first openings to receive the upper gripping pads and the lower gripping pads to secure a first size of substrate; and
the upper x-structure and the lower x-structure form second openings to receive the upper gripping pads and the lower gripping pads to secure a second size of substrate.

* * * * *